Nov. 26, 1963 H. SCHMID 3,112,410

TRANSISTOR SWITCH HAVING IMPEDANCE MEANS EFFECTING NEGLIGIBLE DROP BETWEEN EMITTER AND COLLECTOR

Filed Aug. 17, 1959 3 Sheets-Sheet 1

HERMANN SCHMID
INVENTOR

BY Richard G. Stephens
ATTORNEY

Nov. 26, 1963 H. SCHMID 3,112,410

TRANSISTOR SWITCH HAVING IMPEDANCE MEANS EFFECTING NEGLIGIBLE DROP BETWEEN EMITTER AND COLLECTOR

Filed Aug. 17, 1959 3 Sheets-Sheet 2

HERMANN SCHMID
INVENTOR

BY Richard G. Stephens
ATTORNEY

Nov. 26, 1963 H. SCHMID 3,112,410

TRANSISTOR SWITCH HAVING IMPEDANCE MEANS EFFECTING NEGLIGIBLE DROP BETWEEN EMITTER AND COLLECTOR

Filed Aug. 17, 1959 3 Sheets-Sheet 3

HERMANN SCHMID
INVENTOR

BY Richard G. Stephens
ATTORNEY

United States Patent Office 3,112,410

Patented Nov. 26, 1963

3,112,410

TRANSISTOR SWITCH HAVING IMPEDANCE MEANS EFFECTING NEGLIGIBLE DROP BETWEEN EMITTER AND COLLECTOR

Hermann Schmid, Binghamton, N.Y., assignor to General Precision, Inc., a corporation of Delaware Filed Aug. 17, 1959, Ser. No. 834,178

18 Claims. (Cl. 307—88.5)

Figure 1:
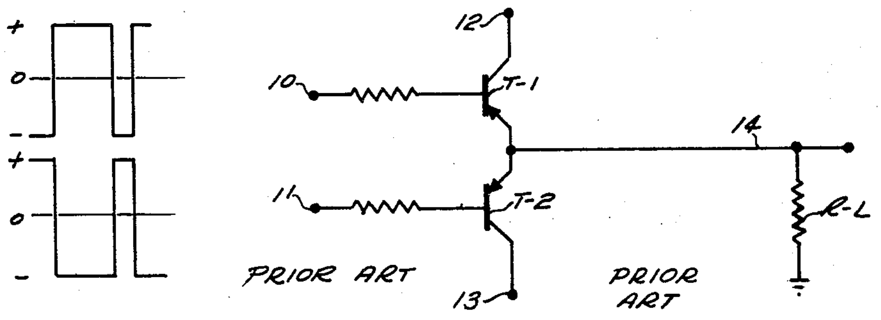

This invention relates to improved electronic switching circuits, and more particularly, to bi-directional electronic switching circuits capable of "single-pole double-throw" and "single-pole single-throw" operation with high accuracy. In an extremely large number of computer, automatic control and instrumentation applications, electronic switching has been substituted for electromagnetic relay switches to provide some of the basic functions of such relay switches. In some applications, such as most digital computers, switching accuracy must be excellent as far as time is concerned, but the output voltage from the switch need not correspond but very roughly in magnitude with an input voltage. In other applications with which the present invention is more concerned, however, it is required that output voltage correspond in magnitude as exactly as possible with an input voltage, or, in other words, that there be as little "voltage drop" across the switch as possible. In some applications the flow of leakage current between two terminals when a switch between the terminals is "open" may be tolerated, while in other applications, such as those with which the present invention is more concerned, such leakage current is desirably made as small as possible or insignificant. Electronic switching circuits in general have replaced mechanical switches and relays in many applications where high-speed switching is required, and the present invention principally pertains to such applications.

A known type of electronic switching circuit, which is shown and described in connection with FIG. 1 herein has received considerable use in recent times, but this type of switch has a number of limitations which render it unsuitable for many applications. It is impossible to draw large load currents through the prior art switch without providing extremely low source impedances in the sources of the voltages to be switched, which requires that low source-impedance input voltages be applied to the switch and that a high impedance load be operated from the switch. A further disadvantage is that the saturation impedance of this switch changes as a function of the control current, so that in cases where the control current must vary, voltage drop errors in the switch cannot be compensated for in any simple manner. The present invention overcomes all these disadvantages with simple and economical circuitry.

In addition, the switching circuits of the present invention may be operated as either "voltage" switches or "current" switches, or, otherwise expressed, to switch a voltage from a low impedance source to a high impedance load, or to switch a current from a high impedance source to a low impedance load. Connected to operate as current switches the invention operates at increased speeds, producing smaller rise-times and fall-times. Such current switches are useful in a number of electronic commutator sampling systems and in certain known analog computer systems.

Thus it is a primary object of the invention to provide improved electronic switching circuits for electronically performing the functions of an electromechanical single-pole single-throw switch or an electromechanical single-pole double-throw switch, using simple, economical and reliable circuitry.

It is a further and more specific object of the invention to provide a switching circuit of the type described in which potentials to be switched need not be applied to the switch through undesirably low source impedances, and in which greater loads may be imposed on the switch without destroying switching accuracy.

It is a further and important object of the invention to provide an electronic switching circuit which may be adjusted so that there is no voltage drop across "closed" terminals, or otherwise stated, to reduce the switch voltage drop to a level which is so low as to be substantially undetectable.

The accuracy and other performance criteria of a number of electronic circuits depend upon the quality of electronic switching circuits incorporated therein. For example, the operation of a number of different types of direct-coupled amplifiers is affected greatly by the quality of modulating switches used therein. Similarly, the linearity and accuracy of some phase-sensitive demodulator circuits are affected greatly by the accuracy of what is actually a switching operation. It is a further object of the invention to provide improved amplifier and demodulator circuits.

Other object of the invention will in part be obvious and will in part appear hereinafter.

The invention accordingly comprises the features of construction, combination of elements, and arrangement of parts, which will be exemplified in the construction hereinafter set forth, and the scope of the invention will be indicated in the claims.

Figure 3A:
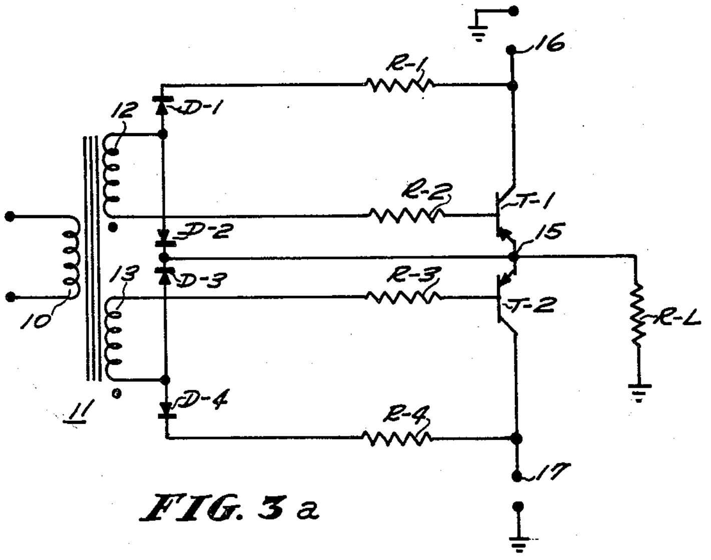
Figure 3B:
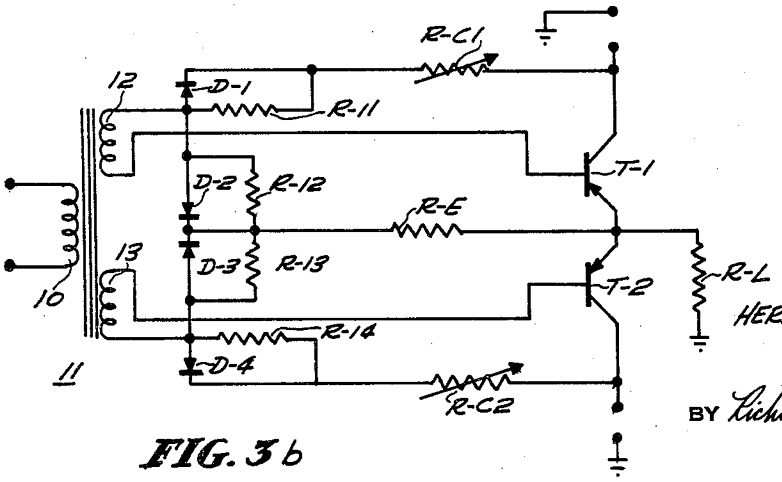
Figure 4:
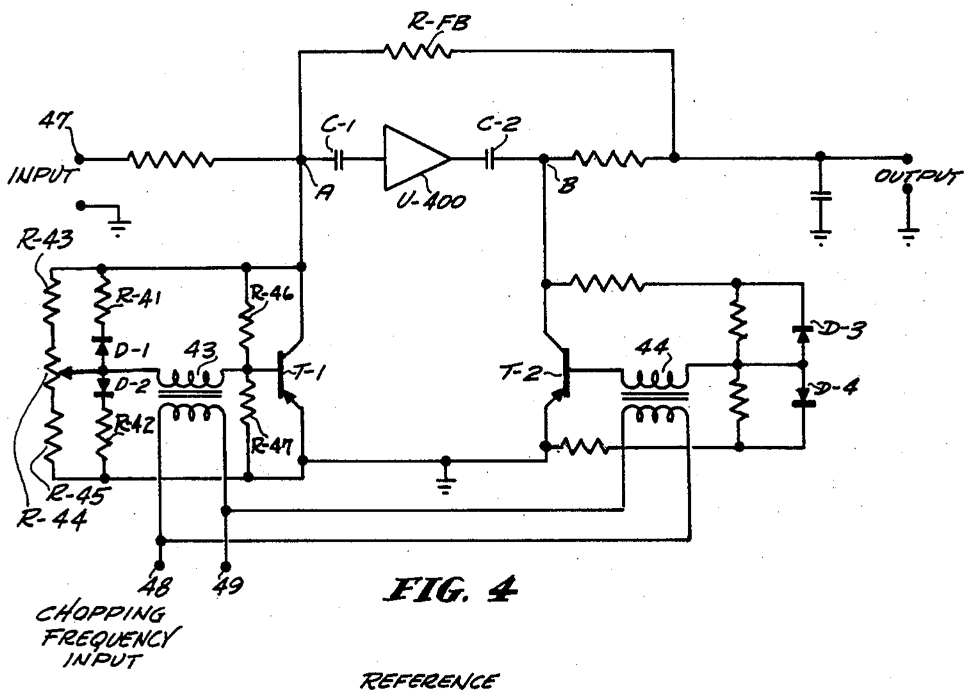
Figure 5:
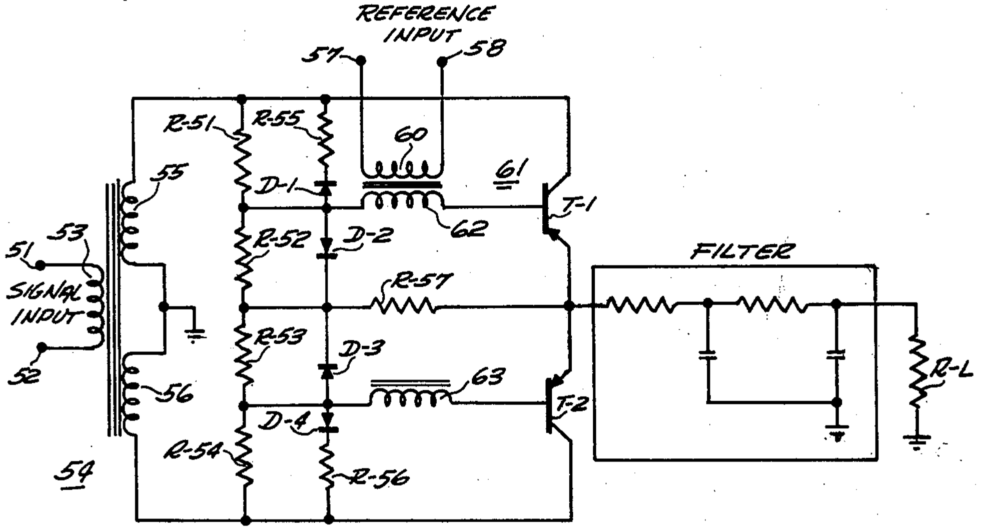

For a fuller understanding of the nature and objects of the invention reference should be had to the following detailed description taken in connection with the accompanying drawing in which:

FIG. 1 is an electrical schematic diagram showing a prior art "single-pole, double-throw" electronic switching circuit driven by push-pull related control signals;

FIGS. 2*a* through 2*f* are simplified electrical schematic diagrams each showing the operating conditions of portions of the invention;

FIG. 3*a* is an electrical schematic diagram showing an exemplary embodiment of the invention;

FIG. 3*b* is a modified form of the circuit of FIG. 3*a* having diode shunting resistors;

FIG. 4 is an electrical schematic diagram illustrating use of the invention in a stabilized modulated-carrier direct-coupled amplifier circuit; and FIG. 5 is an electrical schematic diagram of an improved transistor linear demodulator constructed in accordance with the invention.

Referring to the known push-pull transistor voltage switch shown in FIG. 1, it will be seen that it consists of a pair of like conductivity-type transistors T–1 and T–2, with push-pull control signals applied to the bases of the transistors, the voltages to be switched applied to the transistor collector electrodes, and with the transistor emitter electrodes connected together to form an output terminal 14. While PNP type transistors are shown in FIG. 1, it also is common to use NPN types. If one pair of push-pull related voltages are applied to the bases of the switch, transistor T–1 will become saturated, transistor T–2 will be cut off, and the T–1 collector voltage of terminal 12, less a small drop, usually of the order of 1 or 2 millivolts, will appear at common emitter terminal 14. If, instead, the opposite set of push-pull related control voltages are applied to the bases of the switch, transistor T–2 will become saturated, transistor T–1 will be cut off, and the T–2 collector voltage, less the small drop, will appear at terminal 14. Thus by determining the polarities of the base drive voltages one may effectively switch either input signal terminal 12 or input terminal 13 to output terminal 14.

In order to maintain the voltage drop across the "closed" circuit, i.e. between the signal source and the saturated transistor, at a low value, such as 1 millivolt, it is necessary that the source impedances of the voltages to be switched (i.e., the voltages on terminals 12 and 13) be very low, less than one ohm in many practical circuits, and further necessary that the load impedance R—L fed by the emitter terminals be high, larger than 100 kilo-ohms in many circuits. The low source impedances required of the voltage sources connected to the collector electrodes are necessitated by the fact that base drive currents must be returned through these sources, and if source impedance is very high, the flow of base drive current through the source impedance will cause an appreciable voltage drop on the collector, and hence an appreciable voltage error at output terminal 14.

The base drive current of the conducting transistor flows through the collector-base junction of the transistor and causes a small voltage drop $V_{CB}$ across this junction. The load current $I_L$ flows from the signal source, which is connected to the collector electrode of the saturated transistor, via the collector and emitter electrodes of the transistor, to the load impedance. The base current, or "control" current, $I_B$, flows mainly from the collector electrode to the base electrode, and being dependent upon the voltage between these two electrodes, it will be seen that base current $I_B$ will vary directly with the input voltage applied to the collector electrode. When the input voltage to the collector is most negative the base current will be minimum, using a PNP transistor. The load current must subtract from this minimum base current, and hence allowable load current is limited. The voltage drop $V_{CE}$ across the saturated transistor increases as a function of the difference between base current $I_E$ and load current $I_L$. Some of the shortcomings of the prior art switching circuit can be overcome if, in accordance with the present invention, a large forward-biasing current is caused to flow through both junctions of the saturated transistor.

Figure 2F:
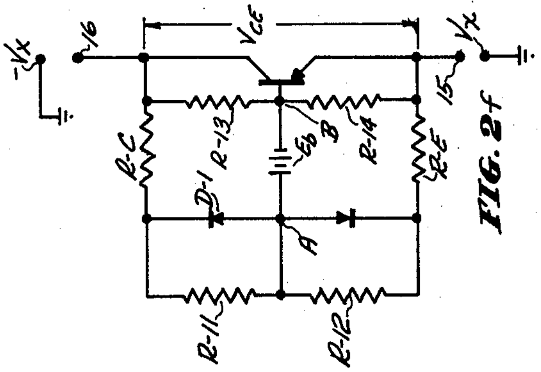
Figure 2C:
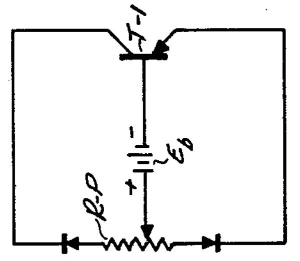
Figure 2E:
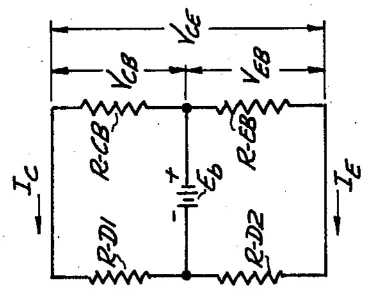
Figure 2B:
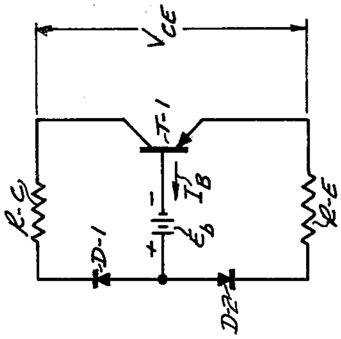
Figure 2A:
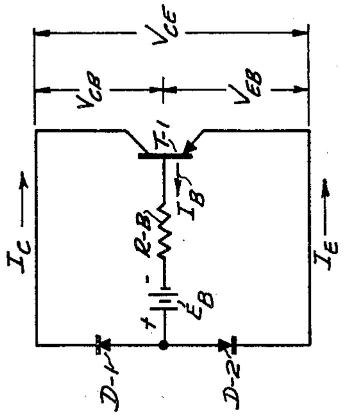

Understanding of how I am able to overcome the above problems of the prior art is facilitated by reference to FIGS. 2*a* through 2*f*, each of which show a portion of the invention under particular operating conditions. In FIG. 2*a* a floating negative base drive voltage $E_b$ represented by a battery is applied to the base electrode through base resistance $R_b$, and both the collector and emitter electrodes of the transistor are returned to the positive side of the base drive source through respective diodes D–1 and D–2. Thus when the base drive voltage has the polarity shown in FIG. 2*a*, it forward biases both the base-emitter junction and the base-collector junction, and maximum, or saturation base current flows. This forward base current $I_B$ is split into a collector current $I_C$ and an emitter current $I_E$. The magnitude of base current $I_B$ will be seen to be determined by the size of base resistor R–B and by the magnitude of the base control voltage $E_b$. The ratio $I_C/I_E$ between the collector current portion and the emitter current portion will be seen to be determined by the ratio between the respective impedances of the two current paths. The collector current path impedance $r_c$ will be seen to equal the sum of the diode D–1 forward resistance and the forward resistance of the collector-base junction of the transistor. The emitter current path impedance $r_e$ will be seen to be the sum of the D–2 diode forward resistance and the forward resistance of the emitter-base junction of the transistor. Thus $I_C/I_E=r_E/r_C$.

Since the voltage drop $V_{CE}$ across a saturated transistor is equal to the algebraic sum of the drop $V_{CB}$ across the collector-base junction and the opposite polarity drop $V_{EB}$ across the emitter-base junction, it may be seen that the overall voltage drop $V_{CE}$ across the transistor may be made zero if the currents through the two paths are adjusted so that $V_{CB}$ is equal in magnitude to $V_{EB}$. This will be seen to be easily accomplished by a large number of different ways; one way would be splitting base resistor R–B into two individual resistances R–C and R–E, one in each current path, as indicated in FIG. 2*b*; or by replacing R–B with an adjustable resistance R–P as shown in FIG. 2*c*. The two diodes D–1 and D–2 of FIGS. 2*a* to 2*c* can also be replaced by an NPN transistor without departing from the invention.

Figure 2D:
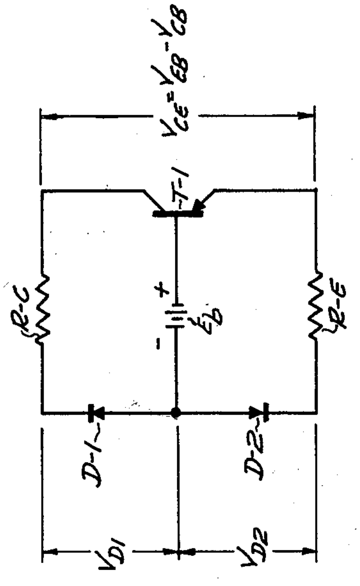

FIG. 2*d* is identical to FIG. 2*a* except the polarity of the base drive source represented by the battery is reversed and the transistor is absolutely cut off, both the base-emitter junction and the collector-base junction being reverse biased under the conditions shown in FIG. 2*d*. In FIG. 2*d* it will be seen that control voltage $E_b$ reverse-biases not only both junctions of the transistor but also both diodes. From FIG. 2*e*, which is an equivalent circuit for FIG. 2*d*, it will be seen that the base control voltage $E_b$ is applied across two circuits, one including the transistor collector-base junction and one including the transistor base-emitter junction. Thus $E_b$ may be seen to equal the voltage drop across the reverse impedance RD–1 of diode D–1 plus the voltage drop $V_{CB}$ across the reverse impedance of the transistor collector-base junction; and similarly, $E_B$ may be seen to equal the voltage drop across the reverse impedance RD–2 of diode D–2 plus the voltage drop $V_{EB}$ across the reverse impedance of the transistor emitter-base junction. During the "open" or cutoff condition of the transistor, it is important that $V_{EB}$ and $V_{CB}$ each be large enough (one-half volt or more with typical transistors) to effectively reverse-bias the two junctions.

When the cutoff transistor is reverse-biased from a floating bias source as shown in FIG. 2*e*, the voltage drops across the diodes and transistor junctions are determined solely by the reverse-impedances of the diodes and junctions and the magnitude of the bias voltage $E_b$. The reverse collector current $I_C$ and the reverse emitter current $I_E$ may be written as follows:

$$I_C=\frac{E_b}{R\text{-}CB+R\text{-}D1}$$

$$I_E=\frac{E_b}{R\text{-}EB+R\text{-}D2}$$

The collector-base junction voltage drop $V_{CB}$ and the emitter-base junction voltage drop $V_{EB}$ may be expressed respectively as follows:

$$V_{CB}=R\text{-}CB\times\frac{E_b}{R\text{-}CB+R\text{-}D1}$$

$$V_{EB}=R\text{-}EB\times\frac{E_b}{R\text{-}EB+R\text{-}D2}$$

If $V_{EB}$ or $V_{CB}$ should be insufficient in magnitude to reverse-bias their respective junctions, or instead, if one of these voltages would tend to exceed the transistor junction breakdown voltage rating, shunt impedances may be used to correct either situation. From the last-stated expression above it will be seen that either R–EB or R–D2 may be shunted with a resistance (not shown) to modify $V_{EB}$. Similarly, either R–CB or R–D1 may be shunted to modify $V_{CB}$. If shunt resistors having approximately ten times less resistance are connected across either the diodes or the transistor junctions, the circuit will be seen to function substantially independently of variation in diode or transistor reverse characteristics. It should be noted that while insertion of sufficiently low resistance resistors in shunt with the transistor junctions will decrease the "Open-circuit" impedance of the cutoff transistor, the decrease in impedance does not materially affect switch performance, and it merely has the same effect as slightly lowering the load impedance. FIG. 2*f* illustrates the circuit of FIGS. 2*a*–2*d* with shunt resistances R–11, R–12, R–13 and R–14 added.

If the signal voltage $V_x$ to be switched, i.e., the voltage between collector and emitter, is zero, the reverse voltages are, of course, governed entirely by the base control voltage $E_b$. If positive and negative signal voltages of $V_x$ in magnitude (and referenced to ground) are applied to collector and emitter terminals 16 and 15, respectively, as shown in FIG. 2*f*, these signal voltages will be seen also to affect the reverse voltages across the diodes and the transistor junctions. Neglecting for a moment shunt resistors R–11, R–12, R–13 and R–14, it will be seen that the voltage between terminals 16 and 15 is applied across two paths, one composed of the two diodes in series, and the other composed of the two transistor junctions in series. Thus each path consists of two oppositely-poled junctions in series. Most of the $V_x$ signal voltage will exist across the reverse-biased junction in each path, and a minimum across the forward-biased junction in each path. For example, if the emitter is returned to $+V_x$ and the collector to $-V_x$ as shown in FIG. 2*f*, and if the base control voltage $E_b$ is made equal to $2V_x$, the potentials at points A and B in FIG. 2*f* will lie substantially at $-V_x$ and $+V_x$, respectively. If $E_b$ then is made larger than $2V_x$, point A, with its lower impedance to ground, will remain substantially at $-V_x$, while point B will assume a potential of $V_x+(E_b-2V_x)$, leaving diode D–1 with a very small forward bias. The current through diode D–1 will be extremely small, however, and not be appreciably detrimental. Diode D–1 may be reverse-biased by selection of resistor R–11, which shunts the collector-base junction of the transistor. Since resistors R–11 and R–12 are several orders of magnitude higher than the resistances of the forward-biased diodes and the resistance of the saturated transistor, resistors R–11 and R–12 have no appreciable effect during the saturated, or "On" condition of the transistor. The shunt resistors R–11 and R–12 can also be replaced by capacitors. As in the case of the resistors, the only purpose of these capacitors would be to reduce the impedance between point A and ground when the switch is open.

FIG. 3*a* shows a complete circuit for an exemplary embodiment of the invention, and it may be seen to comprise two independent floating circuits of the types shown in FIGS. 2*a* and 2*d* interconnected at their emitter terminals. In FIG. 3*a* a switching control current, a square wave current, is applied to the primary winding 10 of transformer 11, which is provided with two separate and independent secondary windings 12 and 13, thereby inducing rectangular wave voltages in windings 12 and 13. Windings 12 and 13 are shown to be isolated from ground and not conductively connected to each other, so interconnection of two of the circuits of FIGS. 2*a* and 2*f* at their emitters may be made without affecting in any way the independent operation of either circuit. Windings 12 and 13 are oppositely poled as indicated, so that winding 12 applies a positive potential to the base of T–1 while winding 13 is applying a negative potential to the base of T–2, and vice versa. Thus transistor T–1 will be heavily forward-biased when transistor T–2 is cut off, and the collector voltage of T–1 will appear at terminal 15; and conversely, when T–1 is cut off T–2 will be heavily forward biased, and the collector voltage of T–2 will appear at terminal 15. The voltages $V_1$, $V_2$ to be switched or selectively applied to output terminal 15 are applied, as shown, to the collectors of transistors T–1 and T–2 at terminals 16 and 17. The $V_1$ and $V_2$ potentials, of course, are sometimes if not always different in magnitude or polarity (or else there would be no reason to use a switching circuit), and diodes D–1, D–2, D–3 and D–4 therefore prevent any appreciable current from flowing from between terminals 16 and 17 while still allowing interconnection of the two floating circuits. Diodes D–1 and D–2 will be seen to be forward-biased to conduct when the voltage of winding 12 is of proper polarity to forward bias the two junctions of transistor T–1, and to be reverse-biased when the voltage of winding 12 reverse-biases the two junctions of transistor T–1. Diodes D–3 and D–4 and winding 12 operate similarly with respect to transistor T–2.

Inasmuch as the magnitude of allowable load current depends upon the magnitudes of the forward currents through the base-emitter and base-collector junctions, the present invention allows the use of much larger load currents, since the magnitude of the base current in a conducting transistor in FIG. 3*a* is limited only by the maximum allowable emitter and collector currents of the particular switching transistors used and by the power capability of the base drive source, but not by the impedances of whatever sources are used to supply voltages $V_1$ and $V_2$. In the prior art switch of FIG. 1, for a "closed" switch voltage drop of 1 millivolt, it is usually required that load current not exceed about 5% of base current, and furthermore, base current itself must be drastically limited since it flows in and out of the signal source. If the source impedances of $V_1$ and $V_2$ remain constant in a particular application, as is often the case, they may even equal the load impedance and still allow switching with very high (±.1%) accuracy, because they effect only a constant attenuation, which can be compensated for, as by means of scaling into a following amplifier. In the invention the signal sources supplying terminals 16 and 17 must supply only the load current and not base current.

The switching accuracy depends, of course, upon maintaining the emitter-collector voltage drop across the conducting transistor as small as possible. I have found that load currents drawn from the saturated transistor may assume approximately 50% of the transistor base current and still maintain the voltage drop across the transistor below one millivolt. Unlike most, if not all, prior art transistor switching circuits, the invention can transmit signals in either direction and hence it is suitable for many applications. For example, terminal 15 may be regarded as an input terminal to which an input current may be applied, and control of the input signal to the primary winding 10 of transformer 11 will selectively apply current to low-impedance loads (not shown) which may be connected to terminals 16 and 17. Current switching accuracy exceeding 10,000 to 1 is easily provided.

The accuracy of the invention depends in part on the susceptibility of the diodes to back currents, since back current through the two diodes paralleling the cut off transistor decreases the efficiency of the switch, and thus diodes having minimum back leakage are preferred. The leakage current through the cutoff diode and transistor determine the minimum signal detectable and switchable.

FIG. 4 illustrates how the abovementioned improved switching circuit may be combined in one type of operational amplifier circuit for stabilization against drift. The susceptibility of direct-coupled amplifiers to drift and various means for drift correction or compensation, especially the use of switching transistors, are well-known in the art, but the present invention allows provision of a better stabilized amplifier than heretofore believed possible with transistor choppers. In an ordinary direct-coupled amplifier thermal effects, particularly those occurring in the first stage of the amplifier, and in the chopper, cause a random or temperature dependent variation in output which causes errors in computation or indication. To prevent such errors, it has become common to use chopper-stabilized D.C. amplifiers, which are extensively covered in the literature, including Chapter 5 of "Electronic Analog Computers," by Korn and Korn, McGraw-Hill, New York, 1956. Also see pages 6–10 to 6–15 of "Control Engineer's Handbook," Truxal, McGraw-Hill, New York, 1958. Most amplifiers stabilized in this manner have used electromechanical vibrator switches, commonly called "choppers" to effect modulation and de-modulation. Such switches are subject to wear and contact pitting, and they also introduce "noise" into the output signal. Various attempts to replace such "choppers" with transistor switching circuitry have been made, but most attempts have resulted in circuits having certain limitations, which the present invention is designed to overcome. Some prior art work in this field is shown in vol. 105, part B, of the Proceedings of the Institution of Electrical Engineers, London, January 1958, in an article by G. B. B. Chaplin and A. R. Owens.

Basically, proper operation as a drift-free amplifier will be obtained in FIG. 4 if terminals A and B, at the input and output respectively of A.C.-coupled amplifier U–400, are alternately connected to ground, the reference potential of FIG. 4. This operation will be seen to require the function of a single-pole double-throw switch. For accurate operation, such a switch should have an extremely small or negligible leakage current when the switch is "open" and most important, an extremely small voltage drop when the switch is "closed." It heretofore has been proposed to make leakage current small by removing reverse bias across the emitter-base junction of a transistor switch, but this technique undesirably reduces the cut-off impedance of the "open" switch, from several megohms to only a few hundred ohms at normal operating temperatures. The voltage drop across "closed" switch terminals has been minimized in the prior art by operating the transistor as a common collector stage, but this still involves a voltage drop of several millivolts, and a significant variation in output voltage as temperature varies. While this offset voltage can be compensated by returning the collector of the switch to a negative potential, it still operates with significant error if temperature changes.

In the modulator switch of FIG. 4, which alternately connects and disconnects input terminal A to ground, the lowest possible voltage drop between terminal A and ground is guaranteed by forward-biasing both the emitter-base and the collector-base junctions when the switching transistor T–1 is supposed to be "closed." Furthermore, however, by relative adjustment of the emitter-base current and the collector-base current, the voltage drop between terminal A and ground can be made zero, providing substantially perfect chopping without any measurable voltage offset. This may be done by adjustment of resistors R–41 and R–42 in FIG. 4, taking into account any difference in the forward impedances of diodes D–1 and D–2, and the impedances of the EB and CB junctions of the transistor, as explained above. By this technique the voltage drop may be adjusted absolutely to zero.

For a chopper it is not only important that the voltage drop across the switch be zero when the switch is closed, but also that there be no leakage current when the switch is open. It is for this latter reason that the shunt resistors R–43 to R–47 are added. The four fixed resistors and the variable resistor may be seen to be a bridge circuit, which can be nulled by varying R–44. It is an important feature of my invention that by means of such a circuit $V_{CE}'$, the voltage across the switching transistor in the cut off state, can be made zero, and thus the leakage current of the chopper made zero. In order that the bridge be fairly independent of the variations of the diode and transistor reverse impedances, the shunt resistor should be of the order of 10K for germanium transistors and 500K for silicon transistors. Although these shunt resistors reduce the effective cut off impedance of the chopper, the impedances are still ten times or more higher than the cutoff impedance of the circuit described in the Chaplin and Owens paper.

In unsymmetrical junction transistors, where collector area is much larger than emitter area, emitter current must be made much smaller than collector current. Signal current through the "closed" or saturated transistor may be as high as ±1 milliampere in some applications, and in order to keep emitter current small compared to collector current it becomes necessary that both the emitter bias current (through R–42 and D–42) and the collector bias current (through R–41 and D–1) be large compared to the signal current (from terminal A to ground). If symmetrical junction transistors are used, the requirement is satisfied much more easily, since both currents are of the same order. It might well be mentioned at this point that in any of the circuits shown herein the emitter and collector of the transistor may be interchanged without departing from the invention, and, of course, symmetrical transistors, where emitter and collector do not differ, may be employed.

Operation of transistor T–2 as a demodulator switch will be readily understood from the foregoing without extensive explanation. The performance requirements of the modulator switch T–1 are considerably more stringent than those of the demodulator switch, since amplifier gain acts on the voltage at point A, and transistor T–2 functions completely adequately. If the complete stabilized amplifier of FIG. 4 is designed to provide an overall voltage gain (by making feedback resistor R–FB larger in resistance than input resistor R–1), secondary winding 44 may be provided with more turns than winding 43, so that the reverse-bias applied to the junctions of demodulator transistor T–2 will exceed, by several volts, the signal voltage at terminal B. It should be noted also that diodes D–3 and D–4 are in series with the junctions of transistor T–2. The breakdown voltage ratings of these junctions need not exceed the reverse bias voltage of transformer 44, which permits the use of high-frequency transistors having low rated emitter-base breakdown voltage rating. The breakdown voltages of transistor T–1 in FIG. 4 are hardly significant, of course, since the amplifier feedback operates to maintain terminal A close to ground potential. While I have shown my improved switch connected in FIG. 4 both as a modulator and a demodulator, it will be apparent that only one need be used. For example, the T–1 modulator circuit can be used in an amplifier which employs an ordinary chopper or some other type of demodulator in place of the T–2 demodulator circuit shown, since demodulator performance is not as critical in a feedback amplifier. It should be noted that my improved switch may be used in a variety of other amplifiers where "chopping" is required as well as in the specific type of amplifier shown in FIG. 4.

FIG. 5 illustrates the invention embodying an improved phase-sensitive demodulator having excellent linearity and low-voltage characteristics. An ideal phase-sensitive demodulator should exhibit a high input impedance, a low output impedance and zero voltage drop, it should be perfectly linear, and should have no "offset" or dead-band around its zero input condition. The circuit illustrated in FIG. 5 approaches most of these characteristics.

The alternating signal to be demodulated is applied as a signal input voltage at terminals 51 and 52 of primary winding 53 of transformer 54, inducing voltages in secondary windings 55 and 56. A reference voltage, the phase of which the signal voltage is to be compared against, is applied at terminals 57 and 58 to excite primary winding 60 of transformer 61, thereby inducing base drive voltages in secondary windings 62 and 63. Winding 63 is shown separate from the remainder of transformer 61 for sake of clarity. The reference voltage applied to transformer 61 may be either a square-wave voltage or a sine-wave voltage, in either case having the same frequency as the signal input voltage. If the signal input voltage is a sine wave which crosses zero at the same instants as a square-wave reference voltage or a sine-wave reference voltage cross zero, a full wave rectified sine wave output will be provided from the demodulator, and the polarity of the output will depend on the relationship between the instantaneous polarities of the signal voltage and the reference voltage. The output may be filtered, if desired, by a conventional filter as shown in FIG. 5. In brief, the circuit of FIG. 5 will be seen to operate like a relay having S.P.D.T. contacts, where the relay is opened and closed by the reference voltage and where the relay contacts switch the signal input voltage. It will be apparent without further explanation that use of my improved switching circuit will provide a greatly improved phase-sensitive linear demodulator. Since all the base control current need not be supplied by the input signal source, the input signal source impedance in FIG. 5 can be much higher than in previous transistor demodulators, and since the emitter and collector currents may be adjusted as explained above so that the voltage drop from emitter to collector of each transistor is zero upon saturation, there will be no "offset or deadband" around zero.

The purpose of resistors R–55, R–56 and R–57 is that of limiting the forward biasing current. For a given type of transistor, these three resistors may be fixed, although collector-emitter voltage drops of less than 100 microvolts may result during saturation.

The magnitude of forward-biasing base current should be somewhere between about .5–20 ma. (using typical alloy junction germanium transistors), depending on how much load current must be supplied from the switch. Generally speaking, base current should be made about twice as much as load current. The magnitude of base drive voltage $E_b$, which is determined by the magnitude of the maximum voltage to be switched, should in general be more than twice the magnitude of the maximum signal to be switched. The sizes of R–55, R–56, and R–57 then may be calculated from maximum $E_b$ and maximum base current $I_{b_{max}}$. In order to avoid distortion and loading of the signal source, it is necessary that the signal source impedance be at least ten times lower than the load impedance.

The linearity of the demodulator circuit of FIG. 5 is determined by the magnitude of the voltage drop $V_{CE}$ across the conducting transistor, and by the variation of $V_{CE}$ as input signal amplitude varies. In conventional prior art demodulators using the switching circuit of FIG. 1, the voltage drop $V_{CE}$ usually can be made as small as 1 millivolt if base current stays at a given magnitude and if the load impedance resistance is kept very high, making it possible to achieve ±.01% of full scale linearity, over a perhaps ±10 volt signal range. In the invention, however, $V_{CE}$ can be maintained effectively zero if base current $I_B$ is kept at least an order higher than load current $I_L$, and hence the linearity of the new transistor demodulator is almost perfect.

The zero stability of either the prior art circuit or the present demodulator is determined by the amount of variation in $V_{CE}$ and by a voltage drop across the signal source impedance. In the conventional modulator $V_{CE}$ usually varies as much as ±0.2 millivolt, and the voltage drop varies since current from the signal source varies. In the improved demodulator, the variation of $V_{CE}$ may be held to about ±0.05 millivolt, and furthermore no base current flows to the signal source, making signal source current and consequently signal source voltage drop much less.

In the prior art transistor demodulator the maximum permissible load current for a required $V_{CE}$ drop, of say 1 millivolt, is usually about one-twentieth of base current, and maximum base current is limited by signal source impedance. In general, load currents of the prior art demodulator cannot exceed 0.1 ma. Conversely, in the present invention, load current may be as high as 50% of base current, and furthermore, base current itself is not limited by the signal source impedance, but only by the characteristics of the particular transistors used. Using 150 milliwatt transistors load currents up to 10 ma. may be drawn. Using appropriate power transistors load currents as high as 100 ma. and higher are possible.

The dynamic range of a demodulator is the ratio between the output for maximum input to the output for zero input. In the conventional transistor demulator with a $V_{CE}$ drop of 1 millivolt and a maximum output voltage of 10 volts, the dynamic range is 10,000. Since $V_{CE}$ may be made substantially zero with the present invention, the dynamic range easily exceeds 100,000 and approaches infinity.

In FIG. 5 a portion of the resistances shown as R–55 and R–57 may be included in the winding of a variable potentiometer (not shown) connected between diodes D–1 and D–2, with the potentiometer wiper connected to winding 62 and the junction between R–51 and R–52 connected to a center-tap on the winding. Adjustment of the potentiometer will allow adjustment of the conducting state voltage drop $V_{CE}$ of transistor T–1 to zero. A similar potentiometer connection may be employed with transistor T–2 for the same purpose. Adjustment of the "conducting state" voltage drop can, however, be achieved with any method that will change the ratios of $I_C$ and $I_E$, without departing from the invention.

Inasmuch as either symmetrical or unsymmetrical transistors may be used in practicing the invention, the terms "collector" and "emitter" are used in the claims herein merely for reference, and the words may be interchanged without departing from the invention.

It will thus be seen that the objects set forth above, among those made apparent from the preceding description, are efficiently attained, and since certain changes may be made in the above constructions without departing from the scope of the invention, it is intended that all matter contained in the above description or shown in the accompanying drawing shall be interpreted as illustrative and not in a limiting sense.

Having described my invention, what I claim as new and desire to secure by Letters Patent is:

1. An electronic switching circuit having a signal terminal and an output terminal, said circuit being operable upon application of a control voltage varying in polarity to apply and disconnect electrically said signal terminal to and from said output terminal, comprising in combination; a transistor having a base terminal and emitter and collector electrodes, one of said electrodes being connected to said signal terminal and the other of said electrodes being connected to said output terminal; circuit means for applying said control voltage between said base terminal and a fourth terminal; a first circuit including a first diode and a first resistance connected in series between said fourth terminal and said collector electrode; a second circuit including a second diode and a second resistance connected in series between said fourth terminal and said emitter electrode; wherein the sum of the impedance of said first resistance, the forward impedance of said first diode and the collector-base junction forward impedance of said transistor is made substantially equal to the sum of said second resistance, the forward impedance of said second diode and the base-emitter junction forward impedance of said transistor, whereby the voltage drop across the collector-base junction substantially equals the voltage drop across the base-emitter junction, substantially to eliminate any voltage drop between said collector and said emitter when said transistor conducts.

2. Apparatus according to claim 1 in which said control voltage comprises the output voltage from a secondary winding of a transformer, said winding being left floating with respect to a reference level.

3. Apparatus according to claim 1 in which said control voltage has a maximum magnitude at least twice as great as said input signal.

4. Apparatus according to claim 1 having third and fourth resistances connected in parallel with said first and second diodes, said third and fourth resistances having impedances no greater than 1/10 of the reverse impedances of said first and second diodes, respectively.

5. Apparatus according to claim 1 having third and fourth resistances connected in parallel with said first and second diodes, the impedances of said resistances being selected with respect to the forward impedances of said diodes and the forward impedances of the junctions of said transistor so that the voltage drop across the collector-base junction substantially equals the voltage drop across the base-emitter junction, substantially to eliminate voltage drop between said signal terminal and said output terminal when said transistor conducts.

6. Apparatus according to claim 1 in which said impedances and the load impedance of said utilization device are so proportioned that maximum load current exceeds 10% of base current.

7. Apparatus according to claim 4 in which said third and fourth resistances are at least 100 times greater than the forward impedances of said diodes and said transistor.

8. Apparatus according to claim 1 having third and fourth resistances connected in parallel with the base-emitter junction and the collector-base junction respectively of said transistor, the values of said resistances being selected with respect to the forward impedances of said diodes and the forward impedances of said junctions so that the voltage drop across the collector-base junction substantially equals the voltage drop across the base-emitter junction, substantially to eliminate voltage drop between said signal terminal and said output terminal when said transistor conducts.

9. An electronic switching circuit for selectively applying either a first or a second signal input voltage to an output load by controlling the polarity of a first control voltage applied to said switching circuit, comprising in combination; first and second transistors of like conductivity type each having a base, an emitter and a collector, said first and second signal input voltages being connected individually between respective ones of said collectors and a reference potential, said emitter electrodes being connected together to provide an output terminal, said load being connected between said output terminal and said reference potential; means responsive to said first control voltage for providing second and third control voltages of mutually opposite sense from a pair of voltage sources which are floating with respect to said reference potential; a second terminal, said second control voltage being applied between said base of said first transistor and said second terminal; a third terminal, said third control voltage being applied between said base of said second transistor and said third terminal; a fourth terminal, said emitter electrodes being connected through a first resistance to said fourth terminal; a first series circuit including a first diode and a second resistance connected between said second terminal and said collector of said first transistor; a second series circuit including a second diode and a third resistance connected between said second terminal and said fourth terminal; a third series circuit including a third diode and a fourth resistance connected between said third terminal and said collector of said second transistor; and a fourth series circuit including a fourth diode and a fifth resistance connected between said third terminal and said fourth terminal.

10. A switching circuit according to claim 9 having four further resistances, each of said further resistances being connected in parallel with a respective one of said diodes and having a resistance value which is at least 100 times as great as the forward impedances of its associated diode and said transistor and which is no greater than 1/10 of the reverse impedance of its associated diode.

11. Apparatus according to claim 9 in which said means responsive to said first control voltage comprises a transformer having a primary winding connected to said first control voltage and a pair of secondary windings to provide said second and third control voltages.

12. An electronic switching circuit for selectively applying either a first or a second input voltage to an output load, comprising in combination; first and second transistors of like conductivity type each having a base terminal; an emitter electrode and a collector electrode, said first and second input voltage being connected individually between the first and second of said electrodes and a reference potential, the other two electrodes of said transistors being connected together to provide an output terminal, said load being connected between said output terminal and said reference potential; a transformer having a primary winding and first and second secondary windings, each of said secondary windings having first and second terminals, said first terminal of said first secondary winding being connected through a first resistance to the base terminal of said first transistor, said second terminal of said first secondary winding being connected through a first diode to one electrode of said first transistor and through a second diode to the other electrode of said first transistor, said first terminal of said second secondary winding being connected through a second resistance to the base terminal of said second transistor, said second terminal of said second secondary winding being connected through a third diode to said output terminal and through a fourth diode to the second electrode of said second transistor; and means for applying a control voltage to said primary winding of said transformer to selectively provide either said first or said second voltage at said output terminal.

13. An electronic switching circuit for applying an input current selectively to either a first or a second load, comprising in combination; first and second transistors of like conductivity type each having a base terminal, an emitter electrode and a collector electrode, said first and second loads being connected individually between respective ones of said collector electrodes and a reference potential terminal, said emitter electrodes being connected together to provide an input terminal, said input current being applied to said input terminal and returned through said reference potential terminal; a transformer having a primary winding and first and second secondary windings, each of said secondary windings having first and second terminals, said first terminal of said first secondary winding being connected through a first resistance to the base terminal of said first transistor, said second terminal of said first secondary winding being connected through a first diode to the collector electrode of said first transistor and through a second diode to said input terminal, said first terminal of said second secondary winding being connected through a second resistance to the base terminal of said second transistor, said second terminal of said secondary winding being connected through a third diode to said input terminal and through a fourth diode to the collector electrode of said second transistor; and means for applying a control voltage to said primary winding of said transformer to selectively apply said input current either to said first or said second load.

14. An electronic switching circuit for selectively applying either a first or a second input voltage to an output load, comprising in combination; first and second transistors of like conductivity type each having a base terminal, an emitter electrode and a collector electrode, each of said first and second input voltages being connected individually between one of said collector electrodes and a reference potential terminal, said emitter electrodes being connected together to provide an output terminal, said load being connected between said output terminal and said reference potential; a transformer having a primary control winding and first and second secondary windings; means for applying a control voltage to said primary control winding thereby to induce first and second base drive potentials of opposite instantaneous polarity in said first and second secondary windings, first circuit means for applying said first base drive potential to said first transistor to forward bias the emitter-base junction and the collector-base junction of said first transistor when said first base drive potential is a first polarity, and second circuit means for applying said second base drive potential to said second transistor to forward bias the emitter-base junction and the collector-base junction of said second transistor when said second base drive potential is said first polarity; in which said first secondary winding is connected to apply said first base drive potential between said base terminal of said first transistor and a first terminal, and in which said first terminal is connected to said emitter electrode and said collector electrode of said first transistor through first and second diodes, respectively, said diodes being poled to pass current when said first base drive potential is of proper polarity to forward bias said emitter-base junction and said collector-base junction of said first transistor, and in which said second secondary winding is connected to apply said second base drive potential between said base terminal of said second transistor and a second teminal, and in which said second terminal is connected to said emitter electrode and said collector electrode of said second transistor through third and fourth diodes, respectively, said third and fourth diodes being poled to pass current when said second base drive potential is of proper polarity to forward bias said emitter-base junction and said collector-base junction of said second transistor.

15. A phase-sensitive linear demodulator comprising in combination; a first transformer having a primary winding connected to said first input signal and a center-tapped secondary winding operable to provide second and third signal voltages, the center-tap of said secondary winding being connected to a reference potential terminal; a second transformer having a primary winding connected to be energized by said reference signal and a pair of secondary windings operable to provide first and second control voltages; first and second transistors of like conductivity type, each having a base, an emitter and a collector, said second signal voltage being connected to said collector of said first transistor and said third signal voltage being connected to said collector of said second transistor; a second terminal, said first control voltage being connected to be applied between said base of said first transistor and said second terminal; a third terminal, said second control voltage being connected to be applied between said base of said second transistor and said third terminal; said emitter electrodes of said transistors being interconnected at an output terminal, a fourth terminal, a first resistance connected between said output terminal and said fourth terminal; a first series circuit including a second resistance and a first diode connected between said second terminal and said collector of said first transistor; a second diode connected between said second terminal and said fourth terminal; a second series circuit including a third resistance and a third diode connected between said third terminal and said collector of said second transistor; a fourth diode connected between said third terminal and said fourth terminal; and an output load connected to said output terminal through a low-pass filter.

16. An electronic switching circiut for selectively applying either a first or a second signal input voltage to an output load by controlling the polarity of a first control voltage applied to said switching circuit, comprising in combination; first and second transistors of like conductivity type each having a base, an emitter and a collector, said first and second signal input voltages being connected individually between respective ones of said emitters and a reference potential, said collector electrodes being connected together to provide an output terminal, said load being connected between said output terminal and said reference potential; means responsive to said first contol voltage for providing second and third control voltages of mutually opposite sense from a pair of voltage sources which are floating with respect to said reference potential; a third terminal, said second control voltage being applied between said base of said first transistor and said third terminal; a fourth terminal, said third control voltage being applied between said base of said second transistor and said fourth terminal; a fifth terminal, said collector electrodes being connected through a first resistance to said fifth terminal; a first series circuit including a first diode and a second resistance connected between said emitter of said first transistor and said third terminal; a second series circuit including a second diode and a third resistance connected between said third terminal and said fifth terminal; a third series circuit including a third diode and a fourth resistance connected between said fourth terminal and the emitter of said second transistor; and a fourth series circuit including a fourth diode and a fifth resistance connected between said fourth terminal and said fifth terminal.

17. A circuit according to claim 16 having sixth, seventh, eighth and ninth resistances connected in parallel with respective of said diodes.

18. A circuit according to claim 16 having sixth, seventh, eighth and ninth resistances connected in parallel with respective junctions of said transistors.

References Cited in the file of this patent

UNITED STATES PATENTS

| | | |
|---|---|---|
| 2,698,392 | Herman | Dec. 28, 1954 |
| 2,816,238 | Elliott | Dec. 10, 1957 |
| 2,862,171 | Freeborn | Nov. 25, 1958 |
| 2,889,467 | Endres et al. | June 2, 1959 |
| 2,891,171 | Shockley | June 16, 1959 |
| 2,899,571 | Meyer | Aug. 11, 1959 |
| 2,900,506 | Whetter | Aug. 18, 1959 |
| 2,931,921 | Smelzer et al. | Apr. 5, 1960 |
| 2,935,625 | Schayes | May 3, 1960 |
| 2,988,688 | Benton | June 13, 1961 |
| 2,992,409 | Lawrence | July 11, 1961 |

FOREIGN PATENTS

| | | |
|---|---|---|
| 210,851 | Australia | Mar. 15, 1956 |